(12) United States Patent
Elsherbini et al.

(10) Patent No.: US 11,227,825 B2
(45) Date of Patent: Jan. 18, 2022

(54) HIGH PERFORMANCE INTEGRATED RF PASSIVES USING DUAL LITHOGRAPHY PROCESS

(71) Applicant: Intel Corporation, Santa Clara, CA (US)

(72) Inventors: Adel A. Elsherbini, Chandler, AZ (US); Mathew J. Manusharow, Phoenix, AZ (US); Krishna Bharath, Chandler, AZ (US); William J. Lambert, Chandler, AZ (US); Robert L. Sankman, Phoenix, AZ (US); Aleksandar Aleksov, Chandler, AZ (US); Brandon M. Rawlings, Chandler, AZ (US); Feras Eid, Chandler, AZ (US); Javier Soto Gonzalez, Chandler, AZ (US); Meizi Jiao, Chandler, AZ (US); Suddhasattwa Nad, Chandler, AZ (US); Telesphor Kamgaing, Chandler, AZ (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 15/773,030

(22) PCT Filed: Dec. 21, 2015

(86) PCT No.: PCT/US2015/067157
§ 371 (c)(1),
(2) Date: May 2, 2018

(87) PCT Pub. No.: WO2017/111910
PCT Pub. Date: Jun. 29, 2017

(65) Prior Publication Data
US 2018/0315690 A1 Nov. 1, 2018

(51) Int. Cl.
*H05K 1/03* (2006.01)
*H05K 1/16* (2006.01)
(Continued)

(52) U.S. Cl.
CPC ... *H01L 23/49838* (2013.01); *H01F 17/0006* (2013.01); *H01F 27/2804* (2013.01);
(Continued)

(58) Field of Classification Search
CPC . H01F 17/00; H01F 5/00; H01F 27/00; H01F 27/06; H01F 27/28; H01F 27/30;
(Continued)

(56) References Cited

U.S. PATENT DOCUMENTS 5,015,972 A * 5/1991 Cygan ............... H03H 7/38
333/26
5,065,270 A * 11/1991 Koyanagi ........... G11B 5/31
360/123.41

(Continued)

OTHER PUBLICATIONS

International Search Report and Written Opinion for International Patent Application No. PCT/US2015/067157 dated Sep. 20, 2016, 16 pgs.
(Continued)

*Primary Examiner* — Xiaoliang Chen
(74) *Attorney, Agent, or Firm* — Schwabe, Williamson & Wyatt, P.C.

(57) ABSTRACT

Embodiments of the invention include an electrical package and methods of forming the package. In one embodiment, a transformer may be formed in the electrical package. The transformer may include a first conductive loop that is formed over a first dielectric layer. A thin dielectric spacer material may be used to separate the first conductive loop from a second conductive loop that is formed in the package. Additional embodiments of the invention include forming a (Continued)

capacitor formed in the electrical package. For example, the capacitor may include a first capacitor plate that is formed over a first dielectric layer. A thin dielectric spacer material may be used to separate the first capacitor plate form a second capacitor plate that is formed in the package. The thin dielectric spacer material in the transformer and capacitor allow for increased coupling factors and capacitance density in electrical components.

9 Claims, 11 Drawing Sheets

(51) Int. Cl.
| | |
|---|---|
| H01F 17/00 | (2006.01) |
| H01F 17/06 | (2006.01) |
| H01L 21/02 | (2006.01) |
| H01L 21/50 | (2006.01) |
| H01L 21/60 | (2006.01) |
| H01L 23/48 | (2006.01) |
| H01L 23/60 | (2006.01) |
| G11B 5/17 | (2006.01) |
| G11B 5/31 | (2006.01) |
| G11B 5/147 | (2006.01) |
| G11B 5/187 | (2006.01) |
| H01L 23/498 | (2006.01) |
| H01F 27/40 | (2006.01) |
| H01L 49/02 | (2006.01) |
| H01F 27/28 | (2006.01) |
| H01F 41/04 | (2006.01) |
| H01G 4/33 | (2006.01) |
| H01L 21/48 | (2006.01) |
| H01L 23/66 | (2006.01) |

(52) U.S. Cl.
CPC .......... *H01F 27/40* (2013.01); *H01F 41/041* (2013.01); *H01G 4/33* (2013.01); *H01L 21/486* (2013.01); *H01L 21/4857* (2013.01); *H01L 23/49822* (2013.01); *H01L 23/49827* (2013.01); *H01L 23/66* (2013.01); *H01L 28/00* (2013.01); *H01L 28/10* (2013.01); *H01L 28/60* (2013.01); *H01F 2027/2809* (2013.01); *H01L 2223/6661* (2013.01)

(58) Field of Classification Search
CPC .......... H01F 27/32; H01F 27/29; H05K 1/03; H05K 1/16; H01L 21/02; H01L 21/50; H01L 21/60; H01L 23/41; H01L 23/48; H01L 23/60; G11B 5/17; G11B 5/31; G11B 5/147; G11B 5/187
USPC ........ 174/260, 257, 258, 262, 267; 361/793, 361/729, 811; 336/107, 173, 192, 200, 336/207, 227, 223; 333/24 R, 32, 112, 333/129, 174, 204; 360/123.39, 123.41, 360/123.43, 123, 45, 46, 123.45, 123.46; 29/603.01
See application file for complete search history.

(56) References Cited

U.S. PATENT DOCUMENTS

| | | | | |
|---|---|---|---|---|
| 5,300,903 | A * | 4/1994 | Okamura | H03H 7/09 333/204 |
| 5,502,430 | A * | 3/1996 | Takahashi | H01F 27/2823 336/198 |
| 5,652,561 | A * | 7/1997 | Inoh | H01F 17/0006 336/200 |
| 5,793,272 | A * | 8/1998 | Burghartz | H01F 17/0006 336/200 |
| 6,185,068 | B1 * | 2/2001 | Fujita | G11B 5/313 360/123.41 |
| 6,191,918 | B1 * | 2/2001 | Clarke | G11B 5/313 360/123.2 |
| 6,246,541 | B1 * | 6/2001 | Furuichi | G11B 5/3116 360/123.41 |
| 6,307,818 | B1 * | 10/2001 | Jerman | G11B 11/10532 369/13.17 |
| 6,369,983 | B1 * | 4/2002 | Hong | G11B 5/313 360/123.49 |
| 6,437,441 | B1 * | 8/2002 | Yamamoto | H01L 21/76801 257/262 |
| 6,538,846 | B1 * | 3/2003 | Sato | G11B 5/313 360/125.45 |
| 6,721,130 | B2 * | 4/2004 | Kobayashi | G11B 5/3116 360/123.39 |
| 6,734,526 | B1 | 5/2004 | Tu et al. | |
| 6,914,509 | B2 * | 7/2005 | Yu | G11C 7/065 336/200 |
| 7,298,238 | B1 * | 11/2007 | Eaton | H01F 21/12 323/255 |
| 7,549,216 | B2 * | 6/2009 | Sasaki | B82Y 10/00 29/603.23 |
| 8,643,219 | B2 * | 2/2014 | Yabe | H01F 27/2804 307/104 |
| 8,823,466 | B2 * | 9/2014 | Liu | H01F 17/0013 333/204 |
| 8,994,478 | B1 * | 3/2015 | Sim | H01P 1/20345 333/185 |
| 9,024,713 | B1 * | 5/2015 | Carlson | H01F 27/322 336/60 |
| 9,183,977 | B2 * | 11/2015 | Menath | H01F 17/02 |
| 2002/0044379 | A1 * | 4/2002 | Kobayashi | G11B 5/313 360/123.41 |
| 2002/0075116 | A1 * | 6/2002 | Peels | H01F 17/0013 336/200 |
| 2002/0113682 | A1 * | 8/2002 | Gevorgian | H01F 17/0013 336/200 |
| 2002/0191334 | A1 * | 12/2002 | Hsu | G11B 5/3116 360/123.55 |
| 2003/0001709 | A1 * | 1/2003 | Visser | H01F 17/0006 336/200 |
| 2003/0137383 | A1 * | 7/2003 | Yang | H01F 17/0013 336/200 |
| 2004/0027224 | A1 * | 2/2004 | Giandalia | H01F 17/0013 336/200 |
| 2004/0048132 | A1 * | 3/2004 | Takai | H01M 8/0228 429/513 |
| 2004/0227608 | A1 * | 11/2004 | Nakatani | H01P 5/10 336/173 |
| 2004/0232519 | A1 * | 11/2004 | Van Beek | G01R 27/26 257/531 |
| 2005/0068148 | A1 * | 3/2005 | Yoshida | H01F 17/0013 336/200 |
| 2005/0068675 | A1 * | 3/2005 | Sasaki | G11B 5/3116 360/123.46 |
| 2005/0083607 | A1 * | 4/2005 | Sasaki | G11B 5/1877 360/125.45 |
| 2005/0104706 | A1 * | 5/2005 | Chou | H01F 27/2804 336/200 |
| 2005/0128639 | A1 * | 6/2005 | Sasaki | G11B 5/3903 360/125.45 |
| 2005/0157423 | A1 * | 7/2005 | Sasaki | G11B 5/31 360/123.41 |
| 2005/0174209 | A1 * | 8/2005 | Teshima | H01F 5/003 336/200 |
| 2005/0185337 | A1 * | 8/2005 | Sasaki | G11B 5/3116 360/125.45 |
| 2006/0028313 | A1 * | 2/2006 | Strzalkowski | H01F 27/2804 336/223 |
| 2006/0077028 | A1 * | 4/2006 | Huang | H01F 17/0006 336/223 |
| 2006/0137174 | A1 * | 6/2006 | Sasaki | G11B 5/1877 29/603.01 |

(56) References Cited

U.S. PATENT DOCUMENTS

| | | | | |
|---|---|---|---|---|
| 2006/0145869 A1* | 7/2006 | Appalucci | B65D 81/3453 | 340/572.8 |
| 2006/0202789 A1* | 9/2006 | Hyvonen | H01F 17/0013 | 336/200 |
| 2007/0025586 A1* | 2/2007 | Young | H04R 9/046 | 381/410 |
| 2007/0030659 A1* | 2/2007 | Suzuki | H01F 17/0013 | 361/793 |
| 2007/0033798 A1* | 2/2007 | Yoshida | H01F 17/0013 | 29/602.1 |
| 2007/0057755 A1* | 3/2007 | Suzuki | H01F 17/0013 | 336/200 |
| 2008/0013635 A1* | 1/2008 | Dupuis | H02M 3/33523 | 375/258 |
| 2008/0120828 A1 | 5/2008 | Whitworth et al. | | |
| 2008/0179963 A1* | 7/2008 | Fouquet | H01F 19/08 | 307/104 |
| 2008/0197963 A1* | 8/2008 | Muto | H01F 17/0013 | 336/200 |
| 2008/0309445 A1* | 12/2008 | Suzuki | H01F 27/2823 | 336/183 |
| 2009/0237175 A1* | 9/2009 | Degani | H01F 17/0013 | 333/25 |
| 2009/0243782 A1* | 10/2009 | Fouquet | H01F 19/04 | 336/200 |
| 2009/0243783 A1* | 10/2009 | Fouquet | H01F 19/08 | 336/200 |
| 2009/0289750 A1* | 11/2009 | Ohsawa | H01F 27/2847 | 336/192 |
| 2009/0295528 A1* | 12/2009 | Silva | H01F 3/10 | 336/200 |
| 2010/0020448 A1* | 1/2010 | Ng | H01F 19/04 | 361/1 |
| 2010/0052838 A1* | 3/2010 | Matsuta | H01F 17/0013 | 336/200 |
| 2010/0259351 A1* | 10/2010 | Bogert | H01F 5/003 | 336/200 |
| 2011/0012690 A1* | 1/2011 | Endo | H01P 5/10 | 333/25 |
| 2011/0032065 A1* | 2/2011 | Raczkowski | H01F 27/2804 | 336/200 |
| 2011/0109417 A1* | 5/2011 | Bertram | H01F 19/04 | 336/200 |
| 2011/0148549 A1* | 6/2011 | Kanschat | H01F 19/00 | 333/24 R |
| 2011/0233776 A1* | 9/2011 | Lee | H01L 23/3114 | 257/737 |
| 2011/0241160 A1* | 10/2011 | Kerber | H01L 23/5225 | 257/528 |
| 2011/0291231 A1* | 12/2011 | Jiang | H01L 23/5227 | 257/531 |
| 2012/0022393 A1* | 1/2012 | Pruckner | A61C 1/0015 | 600/547 |
| 2012/0080770 A1* | 4/2012 | Wahl | H01L 23/48 | 257/531 |
| 2012/0122293 A1 | 5/2012 | Coolbaugh et al. | | |
| 2012/0235780 A1* | 9/2012 | Maple | H01F 27/2847 | 336/207 |
| 2013/0082812 A1* | 4/2013 | Yoo | H01F 5/003 | 336/200 |
| 2013/0082813 A1* | 4/2013 | Wi | H01F 5/003 | 336/200 |
| 2013/0265131 A1* | 10/2013 | Yang | H01F 27/29 | 336/192 |
| 2013/0328164 A1* | 12/2013 | Cheng | H01L 28/10 | 257/531 |
| 2014/0055209 A1* | 2/2014 | Ishizuka | H03H 7/38 | 333/129 |
| 2014/0070420 A1* | 3/2014 | Sapone | H01L 23/66 | 257/773 |
| 2014/0078014 A1* | 3/2014 | Kato | H03H 7/38 | 343/860 |
| 2014/0138792 A1 | 5/2014 | Lo et al. | | |
| 2014/0145806 A1* | 5/2014 | Piascik | H01F 5/00 | 335/299 |
| 2014/0176284 A1* | 6/2014 | Lee | H01F 17/0013 | 336/200 |
| 2014/0198418 A1* | 7/2014 | Wang | H01L 27/0288 | 361/56 |
| 2014/0225698 A1* | 8/2014 | Swirhun | H01F 27/292 | 336/192 |
| 2014/0264734 A1* | 9/2014 | Luo | H01L 23/147 | 257/531 |
| 2014/0273825 A1* | 9/2014 | Sapone | H01L 23/60 | 455/41.1 |
| 2014/0313005 A1* | 10/2014 | Bang | H01F 41/041 | 336/200 |
| 2014/0347154 A1* | 11/2014 | Schmelzer | H01F 27/2804 | 336/170 |
| 2015/0029623 A1* | 1/2015 | Yang | H02H 9/046 | 361/56 |
| 2015/0041190 A1* | 2/2015 | Bonifield | H05K 1/162 | 174/257 |
| 2015/0051541 A1* | 2/2015 | Kanemasa | A61M 25/0147 | 604/95.04 |
| 2015/0069572 A1* | 3/2015 | Khanolkar | H01F 27/2804 | 257/531 |
| 2015/0188511 A1* | 7/2015 | Ishizuka | H03H 7/38 | 343/860 |
| 2015/0202409 A1* | 7/2015 | Kanemasa | F16C 1/20 | 604/95.04 |
| 2015/0282308 A1* | 10/2015 | Meyer | H05K 1/181 | 361/729 |
| 2016/0072167 A1* | 3/2016 | Kawai | H01L 23/49822 | 333/24 R |
| 2016/0284461 A1* | 9/2016 | Maruthamuthu | H01F 17/0006 | |
| 2018/0172479 A1* | 6/2018 | Kashima | B66B 11/043 | |

OTHER PUBLICATIONS

International Preliminary Report on Patentability for PCT Patent Application No. PCT/US2015/067157 dated Jul. 5, 2018, 12 pgs.
Office Action from Taiwan Patent Application No. 105137620 dated Apr. 23, 2021, 7 pgs.
Office Action from Taiwan Patent Application No. 105137620 dated Jul. 28, 2021, 3 pgs.

* cited by examiner

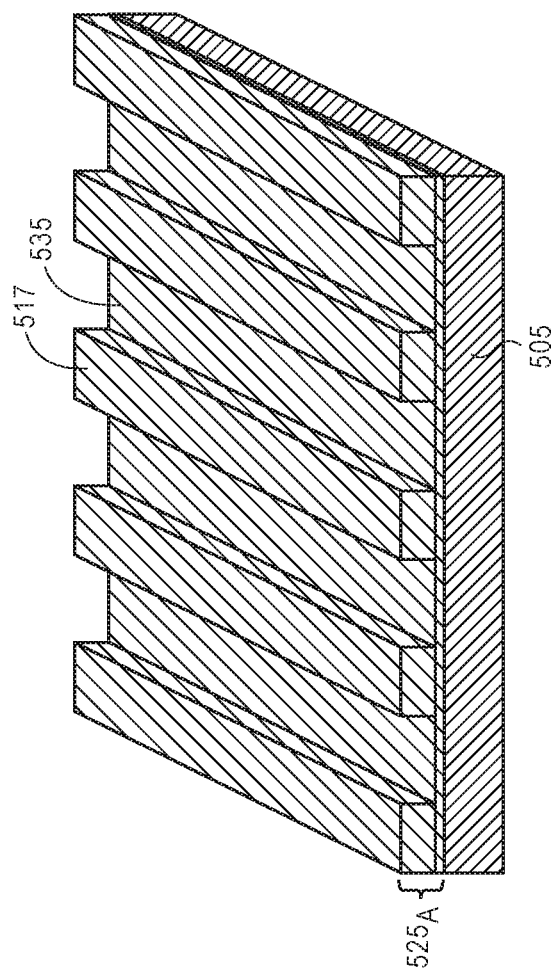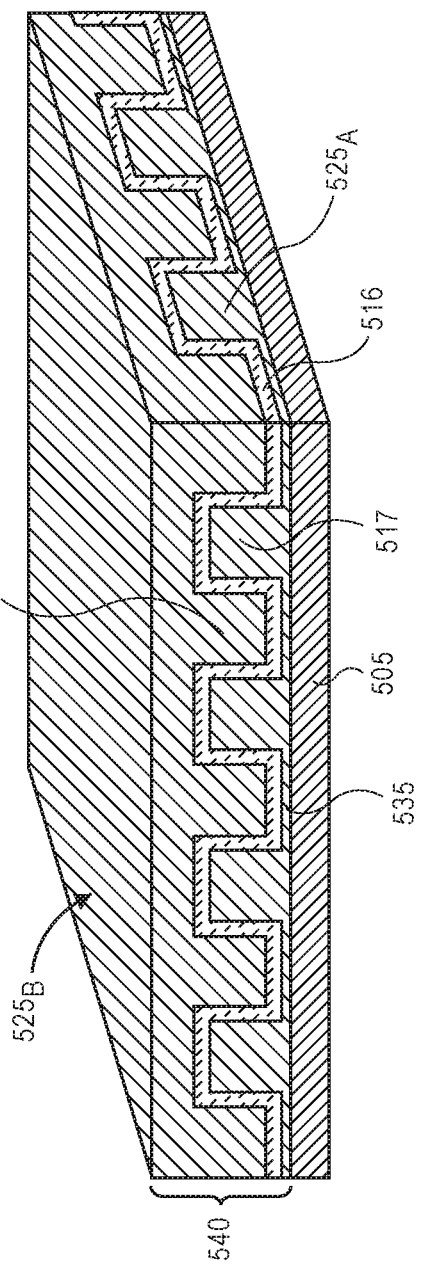
FIG. 5C
FIG. 5D

HIGH PERFORMANCE INTEGRATED RF PASSIVES USING DUAL LITHOGRAPHY PROCESS

CROSS-REFERENCE TO RELATED APPLICATION

This patent application is a U.S. National Phase Application under 35 U.S.C. § 371 of International Application No. PCT/US2015/067157, filed Dec. 21, 2015, entitled "HIGH PERFORMANCE INTEGRATED RF PASSIVES USING DUAL LITHOGRAPHY PROCESS," which designates the United States of America, the entire disclosure of which is hereby incorporated by reference in its entirety and for all purposes.

FIELD OF THE INVENTION

Embodiments of the present invention relate generally to the manufacture of semiconductor devices. In particular, embodiments of the present invention relate to packages that include inductors with improved coupling and capacitors with improved capacitance density and methods for manufacturing such devices.

BACKGROUND OF THE INVENTION

Highly coupled transformers and high density capacitors are useful in many radio frequency (RF) and power delivery applications. In order to provide higher integration in a single package, more passive components (e.g., transformers and capacitors) are fabricated inside the package. However, the current packaging design rules limit the optimization of some of the electrical properties of the components. For example, the minimum allowable spacing between conductive lines in a package makes it difficult to achieve tightly coupled inductors in a small area. Coupling factors higher than about 0.5 are difficult to achieve without consuming a relatively large area and large number of layers on the package. Currently, low coupling factors are accounted for by using resonant transformers in RF by inserting a discrete capacitor in series or in parallel with the transformer to cancel the leakage inductance. This increases the cost and the system size. Furthermore, resonant transformers are narrowband requiring additional transformers for other frequency bands. For power delivery applications (e.g. Buck-Boost or flyback converters), these transformers are implemented as discrete components on the package or on the main board.

In RF applications, capacitors are often used for amplifier tuning or antenna matching. Currently, capacitors can be integrated into the packaging substrate layers. However, the packaging design rules typically require relatively thick dielectric layers (e.g., 20 μm or greater) for separating the parallel plates of the capacitors. Since the capacitance is inversely proportional to the dielectric thicknesses, the capacitance per unit area is relatively small and the desired capacitance is obtained by increasing the package size or by using additional discrete capacitors. In addition to increases in the cost and/or the size of the system, the use of additional discrete capacitors adds more routing parasitics and increases the losses. As such, the maximum operating frequency of the device may be reduced.

Thus, improvements are needed in the area of electronic packaging fabrication in order to form integrated transformers and capacitors with improved coupling and capacitance per unit area, respectively.

BRIEF DESCRIPTION OF THE DRAWINGS

FIG. 5C is a perspective view of a portion of a first conductive plate that may be used in a capacitor with interdigitated extensions, according to an embodiment of the invention.

FIG. 5D is a perspective view of a capacitor with interdigitated extensions, according to an additional embodiment of the invention.

DETAILED DESCRIPTION OF THE INVENTION

Described herein are systems that include a semiconductor package and methods of forming such semiconductor packages. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

Embodiments of the invention include transformer and capacitor structures that are formed with a fabrication technique that is compatible with semi-additive manufacturing process. According to embodiments of the invention, integrated transformers may be formed that have coupling coefficients that are greater than approximately 0.5. Additionally, embodiments of the invention may include integrated capacitors that have a capacitance density that is at least an order of magnitude greater than capacitors that can be formed with currently available technologies.

These significant improvements in performance metrics of integrated transformers and capacitors have several advantages in RF and power delivery applications. For example, higher coupling coefficients in transformers removes the need for using resonant transformers, such as those described above. This allows for the same transformer to be used over a wide frequency band or with lower losses over the same band. Additionally, higher coupling coefficients allows for in-package passives that are capable of being used for up-converting DC-DC converters. This functionality may enable fully integrated up/down converting DC-DC converters for battery operated devices where the battery voltage can drop below the operating voltage of the device. The ability to increase capacitance density of integrated capacitors may allow for capacitors with a relatively small footprint to be used in RF packages. This provides a reduction in the cost of the devices and/or a reduction in the total footprint of the package.

Figure 1:
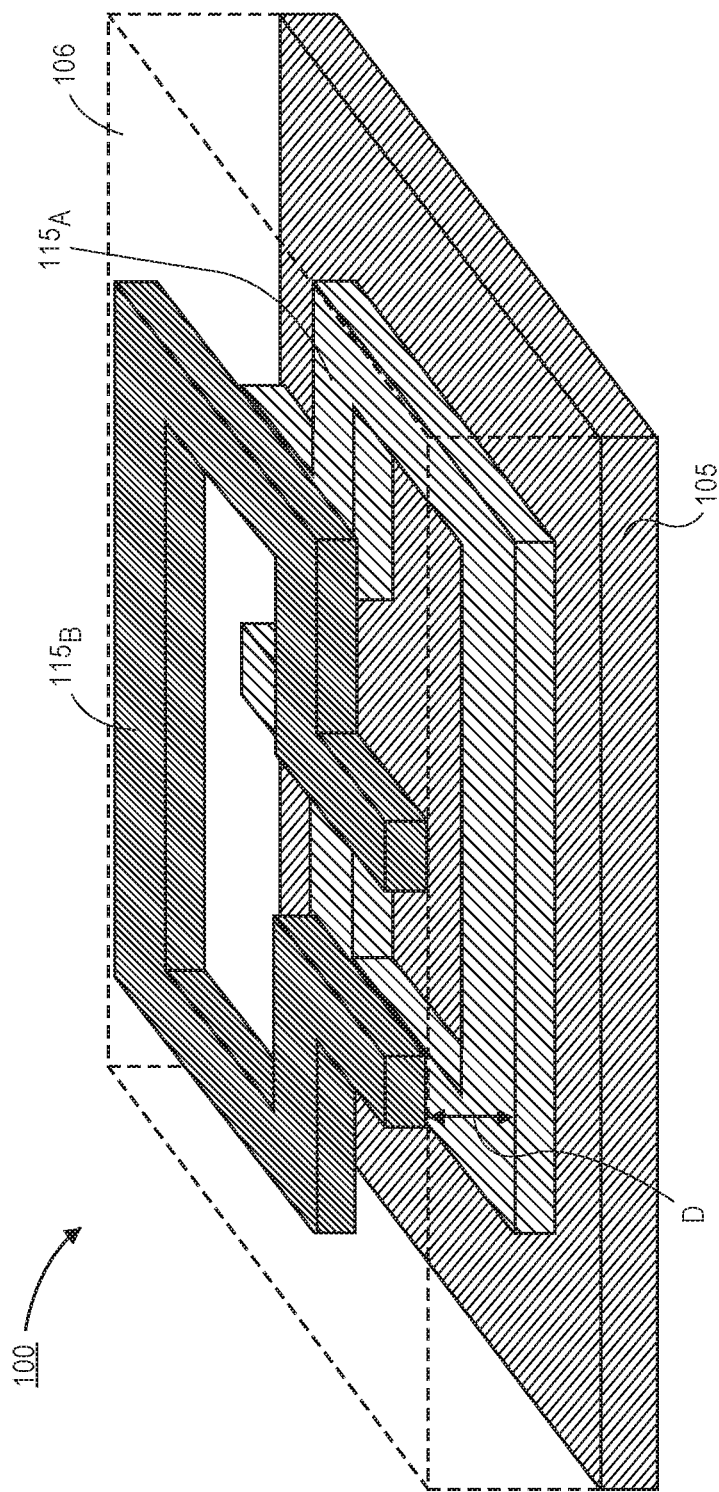
FIG. 1 is a perspective view of a package substrate that includes a transformer.

Referring now to FIG. 1, a perspective view of an integrated transformer 100 formed over a first dielectric layer 105 is shown. Typically, transformers that are integrated into packaging include a first conductive loop $115_A$ formed over the first dielectric layer 105 and a second conductive loop $115_B$ that is formed over a second dielectric layer 106 (the second dielectric layer 106 is illustrated as an invisible layer outlined by dashed lines in order to not unnecessarily obscure other aspects of the Figure). Accordingly, the distance D separating the two conductive loops is dependent on the thickness of the second dielectric layer 106.

Specifically, the coupling factor is defined by Equation 1, where $L_{11}$ is the self-inductance of the first conductive loop $115_A$, $L_{22}$ is the self-inductance of the second conductive loop $115_B$ and $L_{12}$ is the mutual inductance of the first conductive loop $115_A$ and the second conductive loop $115_B$.

$$\text{Coupling Factor} = \frac{L_{12}}{\sqrt{L_{11}L_{22}}} \quad \text{(Equation 1)}$$

Accordingly, increasing the mutual inductance of the transformer will increase the coupling factor. One way to increase the mutual inductances of the two conductive loops is by decreasing the distance D between the loops. However, as noted above, the distance D is limited by the thickness of the second dielectric layer 106. In typical packaging design rules, the second dielectric layer 106 may have a thickness of approximately 25 μm or greater. For one specific example, in an integrated transformer with conductive loops operated at 1 GHz where the conductive loops are spaced at approximately 25 µm, the coupling factor may be approximately 0.45 or less.

As such, embodiments of the invention utilize processing operations that allow for the distance D between the conductive loops to be significantly decreased. In some embodiments of the invention, the distance D between the loops may be decreased to less than 20 µm, which provides a coupling factor that may be greater than 0.5. Additional embodiments may include a distance D that is less than 1 µm. In such embodiments, the coupling factor may be increased to over 0.7. A process that enables the formation of a transformer with highly coupled conductive loops is described with respect to FIGS. 2A-2E.

Figure 2A:
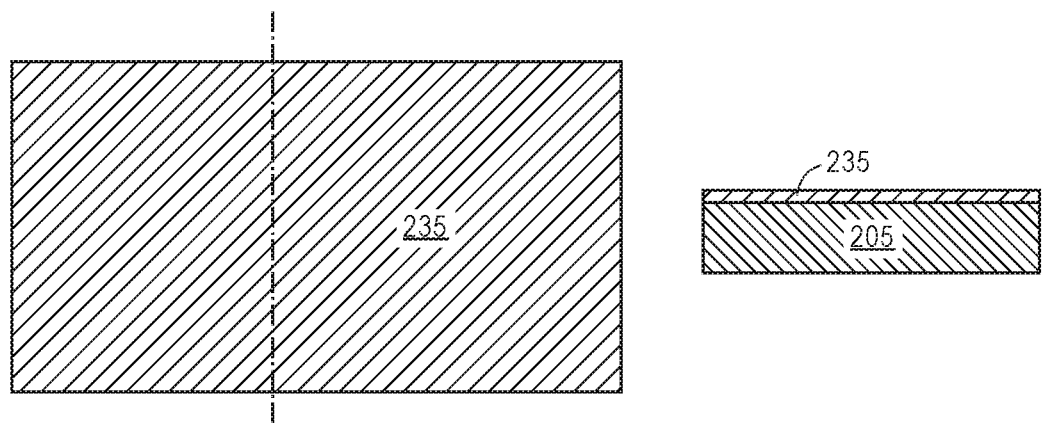
FIG. 2A is a plan view and a corresponding cross-sectional illustration of a package substrate with a dielectric layer that has a seed layer formed over the surface, according to an embodiment of the invention.

Referring now to FIG. 2A, a plan view and a corresponding cross-sectional view of a package layer are illustrated, according to an embodiment of the invention. The package layer may include a dielectric layer 205 that has a seed layer 235 formed over the top surface. By way of example, the dielectric layer 205 may be a polymer material, such as, for example, polyimide, epoxy, or build-up film (BF). In an embodiment, the dielectric layer 205 may be one layer in a stack that includes a plurality of dielectric layers used to form a build-up structure. As such, the dielectric layer 205 may be formed over another dielectric layer. Additional embodiments may include forming the dielectric layer 205 as the first dielectric layer over a core material on which the stack is formed. In an embodiment, the seed layer 235 may be a copper seed layer.

Figure 2B:
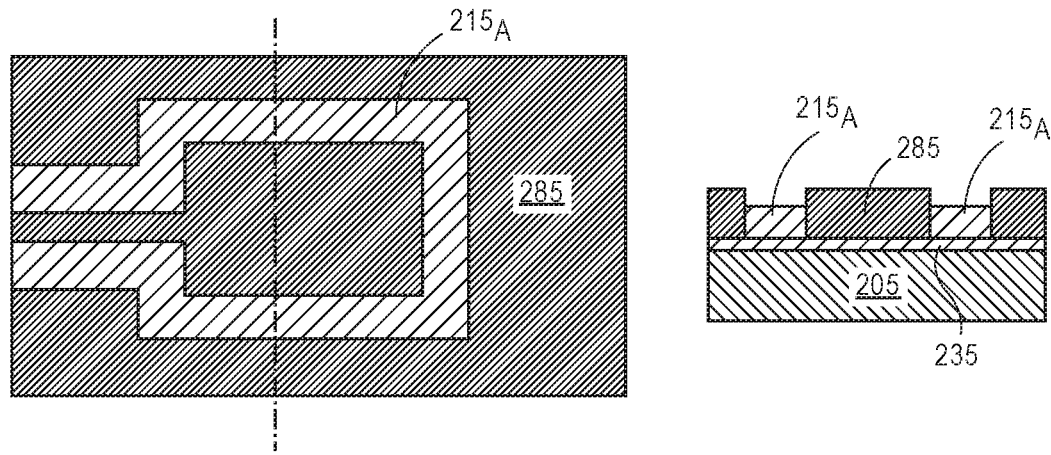
FIG. 2B is a plan view and a corresponding cross-sectional illustration of the package substrate after a first conductive loop is formed over a surface of the substrate, according to an embodiment of the invention.

Referring now to FIG. 2B, a photoresist material 285 may be formed over the seed layer 235 and patterned to provide openings for the formation of a first conductive loop $215_A$. According to an embodiment, the patterning of the photoresist material 285 may be implemented with lithographic processes (e.g., exposed with a radiation source through a mask (not shown) and developed with a developer). After the photoresist material 285 has been patterned, the first conductive loop $215_A$ may be formed. In an embodiment, the first conductive loop $215_A$ may be formed with an electroplating process or the like. It is to be appreciated that while only the first conductive loop $215_A$ is illustrated in the plan view, embodiments of the invention may include forming a plurality of first conductive loops $215_A$ and that the first conductive loops $215_A$ may be formed at the same time as other conductive lines (e.g., signal lines or the like) that are formed over the first dielectric layer 205. According to an additional embodiment, the first conductive loops $215_A$ may be any desired shape. For example, the first conductive loops $215_A$ may each be a spiral shape with multiple turns.

Figure 2C:
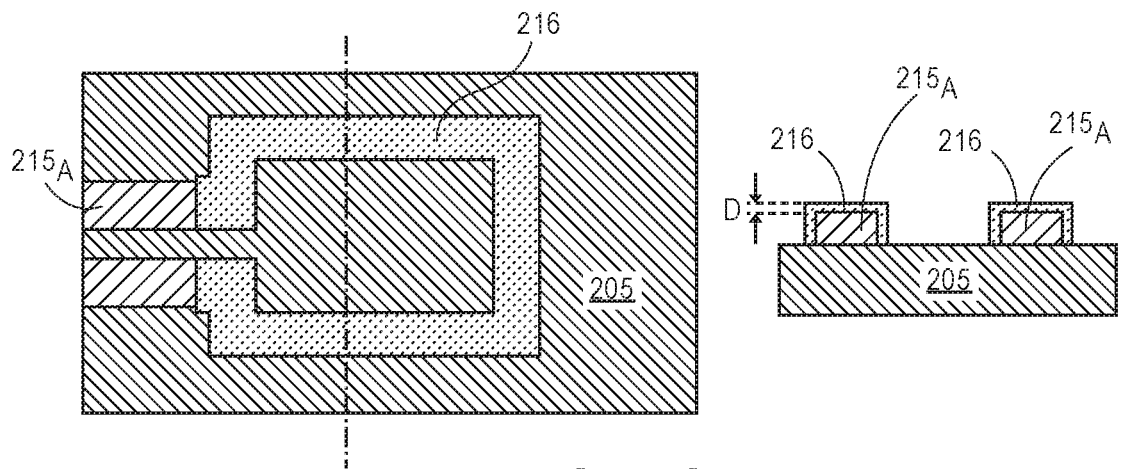
FIG. 2C is a plan view and a corresponding cross-sectional illustration of the package substrate after a dielectric spacer is formed over the first conductive loop, according to an embodiment of the invention.

Referring now to FIG. 2C, the first photoresist material 285 is stripped and the exposed portions of the seed layer 235 are etched back with a seed etching process. Additionally, embodiments of the invention include forming a dielectric spacer layer 216 over the surfaces of the first conductive loop $215_A$. The dielectric spacer layer 216 provides the spacing between the first conductive loop $215_A$ and a second conductive loop $215_B$ that will be formed in a subsequent processing operation. As described above, the coupling factor of a transformer may be increased by decreasing the distance between the first and second conductive loops. Accordingly, controlling the thickness D of the dielectric spacer layer 216 provides the desired coupling factor. In an embodiment, the dielectric spacer layer 216 may have a thickness that provides a coupling factor that is approximately 0.5 or greater. In an embodiment, the thickness D may be less than 20 µm. In some embodiments the thickness D may be less than 5 µm.

Embodiments of the invention are able to form a dielectric spacer layer 216 with a controlled thickness D with any suitable deposition process. In one embodiment, the dielectric spacer layer 216 may be formed with a screen printing process. The screen printing process may optionally be performed prior to removing the first photoresist material 285 in order to improve alignment. In such embodiments, the dielectric spacer layer 216 formed may be omitted from the sidewalls of the first conductive loop $215_A$. Additional embodiments may include a blanket deposition of the dielectric spacer layer 216 after the first photoresist material 285 has been removed. For example, a chemical vapor deposition (CVD) process may be used. In such embodiments, the blanket dielectric spacer layer 216 may then be patterned to remove portions of the dielectric spacer layer 216 from over the first dielectric layer 205. Exposing the first dielectric layer 205 may provide better adhesion for subsequently deposited packaging layers.

Figure 2D:
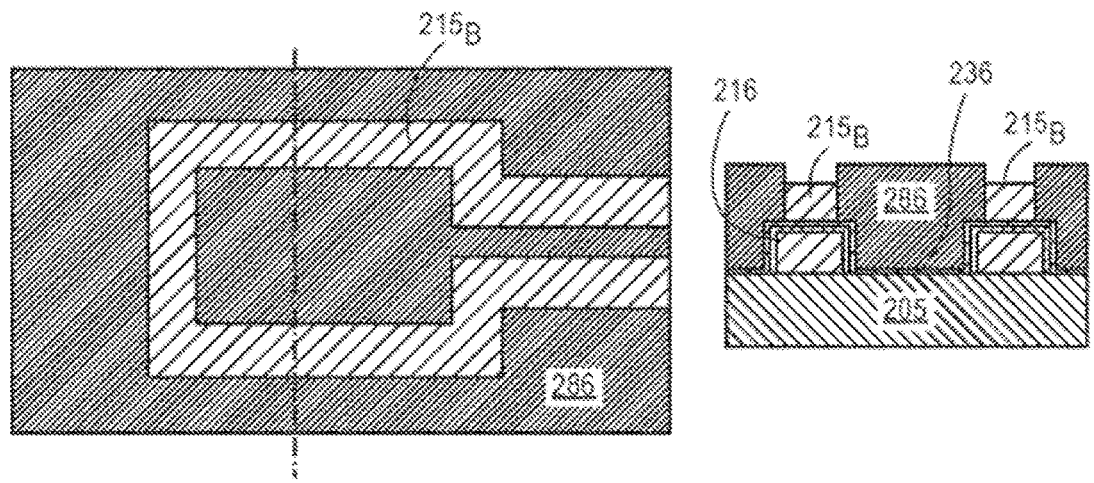
FIG. 2D is a plan view and a corresponding cross-sectional illustration of the package substrate after a second conductive loop is formed over the dielectric spacer, according to an embodiment of the invention.

Referring now to FIG. 2D, a second conductive loop $215_B$ is formed over the dielectric spacer layer 216. In order to allow for the deposition of a second conductive layer over the dielectric spacer layer 216, a second seed layer 236 is formed. The second seed layer 236 may be a copper seed layer that is blanket deposited. The metallic deposition used to form the second conductive loop $215_B$ may be isolated to over the first conductive loop $215_B$ by depositing and patterning a second photoresist material 286 to form openings over the second seed layer 236. The second conductive loop $215_B$ may be formed with an electroplating process or the like. It is to be appreciated that while only the second conductive loop $215_B$ is illustrated in the plan view, embodiments of the invention may include forming a plurality of second conductive loops $215_B$ and that the second conductive loops $215_B$ may be formed at the same time as other conductive features. For example, the second conductive loop $215_B$ may be formed at the same time one or more vias are formed.

Figure 2E:
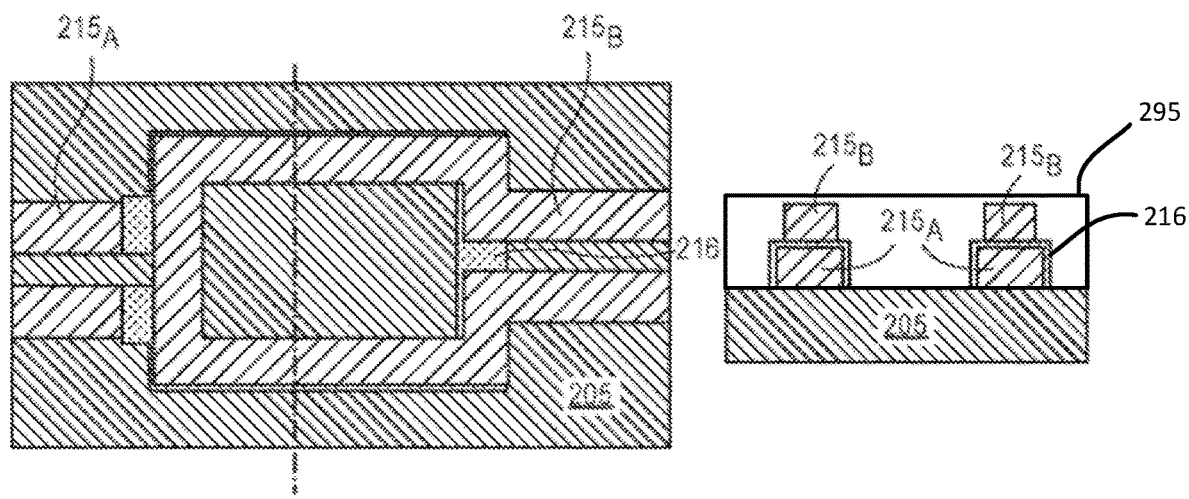
FIG. 2E is a plan view and a corresponding cross-sectional illustration of the package substrate after the second photoresist material and the exposed portions of the seed layer have been removed, according to an embodiment of the invention.

Referring now to FIG. 2E, the second photoresist material 286 is stripped and the exposed portions of the second seed layer 236 are removed. According to an embodiment, the second seed layer 236 may be removed with a seed etching process. Embodiments may then include forming a second dielectric layer 295 over the first and second conductive loops $215_A$ and $215_B$. The second dielectric layer 295 is omitted from the plan view for clarity. According to an embodiment, the second dielectric layer 295 may be formed with any suitable process, such as lamination or slit coating and curing.

While the illustrated process flow in FIGS. 2A-2E produce a transformer with a first conductive loop $215_A$ and a second conductive loop $215_B$ that are formed in a single routing layer of the package, embodiments are not limited to such configurations. For example, the first and second conductive loops may have thickness that are greater than the thickness of a single routing layer. In such embodiments, the conductive loops may still be separated by a dielectric spacer layer substantially similar to dielectric spacer layer 216 described above. As such, the coupling factor may still be greater than approximately 0.5. Increasing the thicknesses of the conductive loops would also provide a decrease in the resistance of the transformer while still maintaining the same inductance.

According to additional embodiments of the invention, a transformer with a high coupling factor may also be formed with the first and second conductive loops having a side-by-side configuration. For example, the second conductive loop may be formed within a perimeter of the first conductive loop. A process for forming such a transformer is described in detail with respect to FIGS. 3A-3E and FIGS. 4A-4D.

Figure 3A:
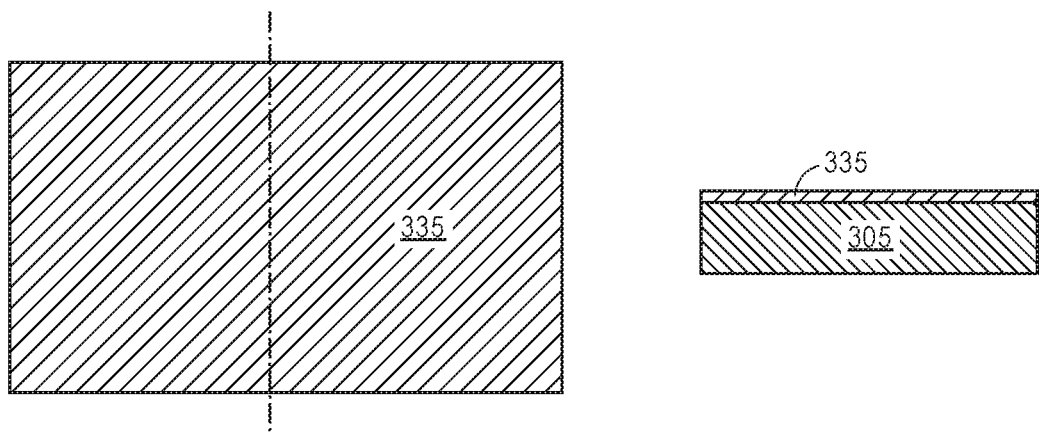
FIG. 3A is a plan view and a corresponding cross-sectional illustration of a package substrate with a dielectric layer that has a seed layer formed over the surface, according to an embodiment of the invention.

Referring now to FIG. 3A, a plan view and a corresponding cross-sectional view of a package are illustrated, according to an embodiment of the invention. The package may include a dielectric layer 305 that has a seed layer 335 formed over the top surface. The dielectric layer 305 and the seed layer 335 may be substantially similar to the dielectric layer 205 that has a seed layer 235 described above, and therefore, will not be repeated here in detail.

Figure 3B:
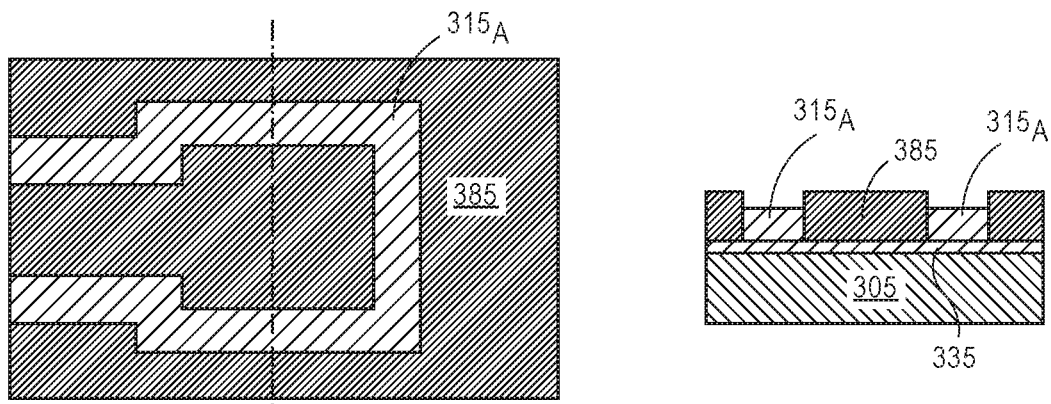
FIG. 3B is a plan view and a corresponding cross-sectional illustration of the package substrate after a first conductive loop is formed over a surface of the substrate, according to an embodiment of the invention.

Referring now to FIG. 3B, a photoresist material 385 may be formed over the seed layer 335 and patterned to provide openings for the formation for a first conductive loop $315_A$. Patterning the photoresist and forming the first conductive loop $315_A$ may be substantially similar to the processing described above with respect to FIG. 2B, and therefore, will not be repeated here in detail. It is to be appreciated that while only a single first conductive loop $315_A$ is illustrated in the plan view, embodiments of the invention may include forming a plurality of first conductive loops $315_A$ and that the first conductive loops $315_A$ may be formed at the same time as other conductive lines (e.g., signal lines or the like) that are formed over the first dielectric layer 305.

Figure 3C:
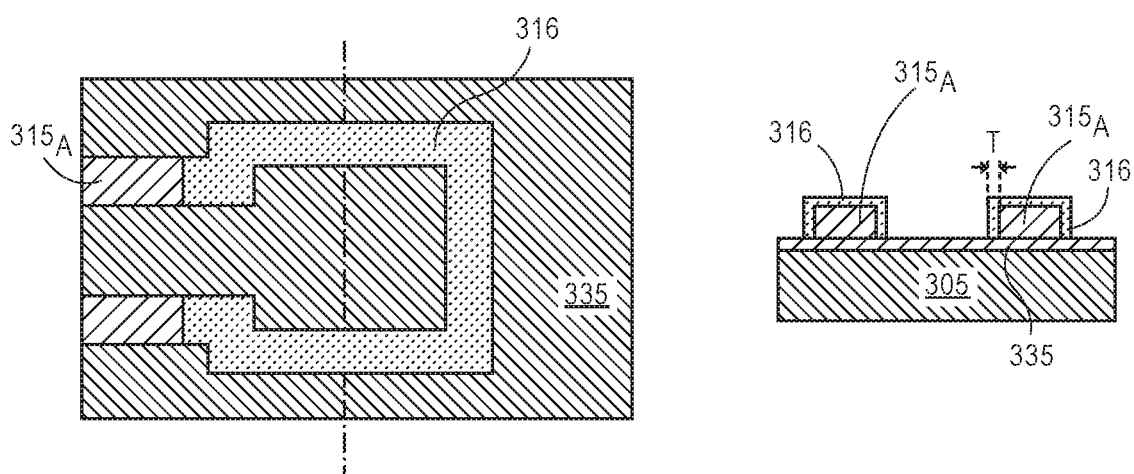
FIG. 3C is a plan view and a corresponding cross-sectional illustration of the package substrate after a dielectric spacer is formed over the first conductive loop, according to an embodiment of the invention.

Referring now to FIG. 3C, the first photoresist material 385 is stripped and a dielectric spacer layer 316 may be formed over the surfaces of the first conductive loop $315_A$. The dielectric spacer layer 316 provides the spacing between the first conductive loop $315_A$ and a second conductive loop $315_B$ that will be formed in a subsequent processing operation. As described above, the coupling factor of a transformer may be increased by decreasing the distance between the first and second conductive loops. Since the second conductive loop $315_B$ will be formed alongside the first conductive loop $315_A$ (i.e., the sidewalls of each loop will face each other), the thickness T of the sidewall portion of the dielectric spacer 316 needs to be controllable in order provide the desired coupling factor. In an embodiment, the dielectric spacer layer 316 may have a thickness T along the sidewalls of the first conductive loop $315_A$ that provides a coupling factor that is approximately 0.5 or greater. In an embodiment, the thickness T may be less than 20 µm. In some embodiments the thickness T may be less than 5 µm.

In the embodiment illustrated in the cross-sectional view in FIG. 3C, the dielectric spacer layer 316 is illustrated as being a single material. However embodiments are not limited to such a configuration. For example, in some embodiments, the sidewall portions of the dielectric spacer layer 316 may be a different material than the portion formed on the top surface of the conductive loop. A process flow according to one embodiment of the invention that includes such a dielectric spacer layer is illustrated in FIGS. 4A-4D.

Figure 4A:
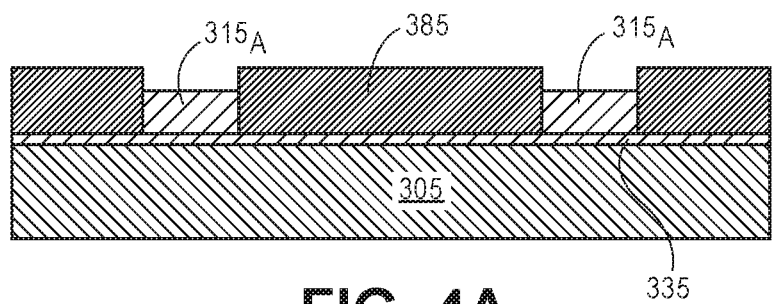
FIG. 4A is a cross-sectional illustration of a package substrate after a first conductive loop is formed in a patterned photoresist layer, according to an embodiment of the invention.

Referring now to FIG. 4A, a cross-sectional view of a first conductive loop $315_A$ is illustrated according to an embodiment of the invention. The conductive loop $315_A$ may be substantially similar to the conductive loop $315_A$ illustrated in FIG. 3B. In one embodiment, a top surface of the first conductive loop $315_A$ is recessed below a top surface of the first photoresist layer 385.

Figure 4B:
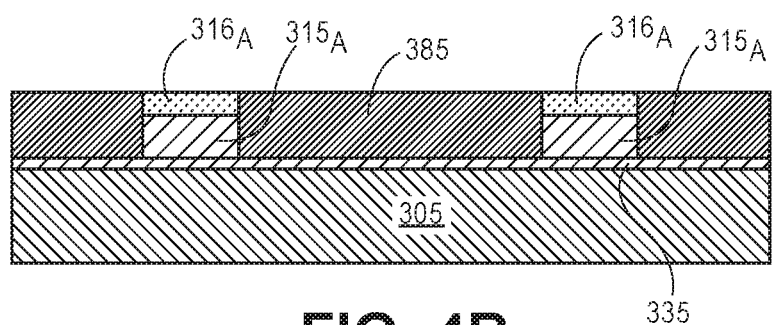
FIG. 4B is a cross-sectional illustration of a package substrate after a cap dielectric is formed over the first conductive loop, according to an embodiment of the invention.

Referring now to FIG. 4B, a dielectric cap layer $316_A$ may be selectively deposited over the top surfaces of the first conductive loop $315_A$. The dielectric cap layer $316_A$ may be formed with a stencil printing process, or any other suitable deposition process. Since the second conductive loop $315_B$ will be formed side-by-side with the first conductive loop $315_A$, the thickness of the dielectric cap layer $316_A$ does not need to be as thin as the sidewall portions of the dielectric spacer layer 316 formed in a subsequent processing operation.

Figure 4C:
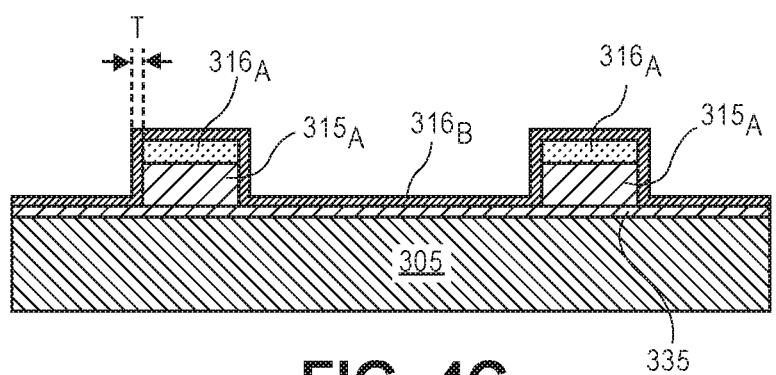
FIG. 4C is a cross-sectional illustration of a package substrate after the photoresist layer is removed and a sidewall dielectric is blanket deposited over the exposed surfaces, according to an embodiment of the invention.

Referring now to FIG. 4C, the first photoresist material 385 is stripped and a sidewall dielectric spacer layer $316_B$ is blanket deposited over the exposed surfaces. According to an embodiment, the sidewall dielectric layer may be any suitable material that can be conformally deposited in a layer that has a thickness T small enough to provide the desired coupling factor in the side-by-side transformer. For example, the thickness T may be less than 20 µm. Additional embodiments may include a thickness T that is less than 10 µm. By way of example, the sidewall dielectric spacer layer $316_B$ may be deposited with a CVD or any other blanket deposition process.

Figure 4D:
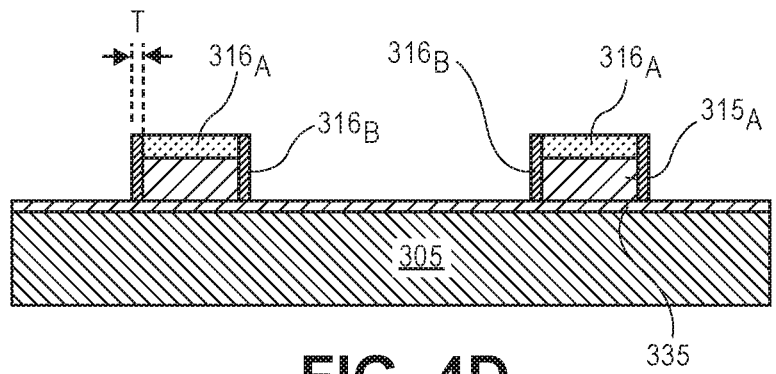
FIG. 4D is a cross-sectional illustration of a package substrate after the sidewall dielectric layer is etched to provide sidewall dielectric spacers along the sidewalls of the first conductive loop, according to an embodiment of the invention.

Referring now to FIG. 4D, the sidewall dielectric spacer layer $316_B$ is removed from the horizontal surfaces. According to an embodiment, the sidewall dielectric spacer layer $316_B$ may be selectively removed from the horizontal surfaces with an anisotropic etching process, such as a reactive ion etching (RIE) process. The selective etching process allows for only portions of the sidewall dielectric spacer $316_B$ to remain along the sidewalls of the first conductive loop $315_A$. According to an embodiment, the dielectric cap layer $316_A$ may be a material that is resistant to the etching process used to selectively etch the sidewall dielectric spacer $316_B$. As such, the dielectric cap layer $316_A$ may serve as an etch stop that prevents portions of the top surface of first conductive loop $315_A$ from being exposed. Protecting the top surface of the first conductive loop $315_A$ allows for an increased margin of error in the alignment of a patterning operation that will be used to form the second conductive loop $315_B$, as will be described in greater detail below.

Referring again back to the process flow described with respect to FIGS. 3A-3E, the processing flow may continue after the dielectric spacer 316 is formed over the first conductive loop $315_A$. As illustrated in the remaining Figures, the dielectric spacer 316 is depicted as being a single material, though it is to be appreciated that embodiments of the invention may include a dielectric spacer 316 that includes a dielectric cap layer $316_A$ and a sidewall dielectric spacer $316_B$ substantially similar to the one described above with respect to FIG. 4D.

Figure 3D:
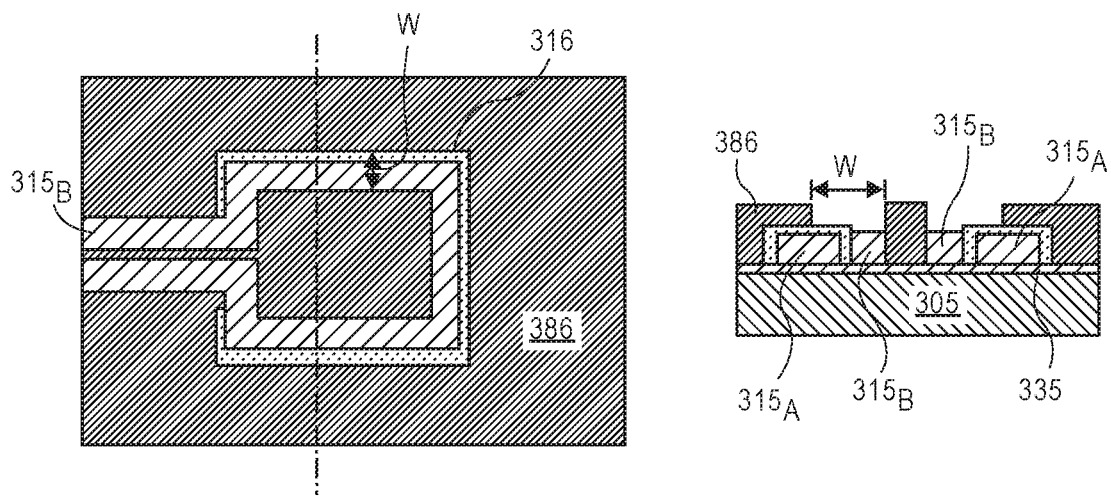
FIG. 3D is a plan view and a corresponding cross-sectional illustration of the package substrate after a second conductive loop is formed within the perimeter of the first conductive loop, according to an embodiment of the invention.

Referring now to FIG. 3D, a second conductive loop $315_B$ is formed alongside the first conductive loop $315_A$. The metallic deposition used to form the second conductive loop $315_B$ may be done by depositing and patterning a second photoresist material 386 to form openings over the seed layer 335. The openings may have a width W that extends over a top surface of the first conductive loop $315_A$. However, since the top surface is covered by the dielectric spacer layer 316, no further plating will occur. As such, the second conductive loop $315_B$ may be formed in direct contact with the sidewall portion of the dielectric spacer layer 316 without the need for highly accurate patterning of the photoresist layer. Accordingly, the spacing between the sidewall of the first conductive loop $315_A$ and the sidewall of the second conductive loop $315_B$ may be limited only by the minimum thickness T of the sidewall portion of the dielectric spacer 316 instead of by the design rules for the fabrication of interconnect lines in the package. In the illustrated embodiment, the second conductive loop $315_B$ is formed inside a perimeter of the first conductive loop $315_A$. However, embodiments are not limited to such configurations. For example, the second conductive loop $315_B$ may optionally be formed along the outer sidewalls of the first conductive loop $315_A$.

Figure 3E:
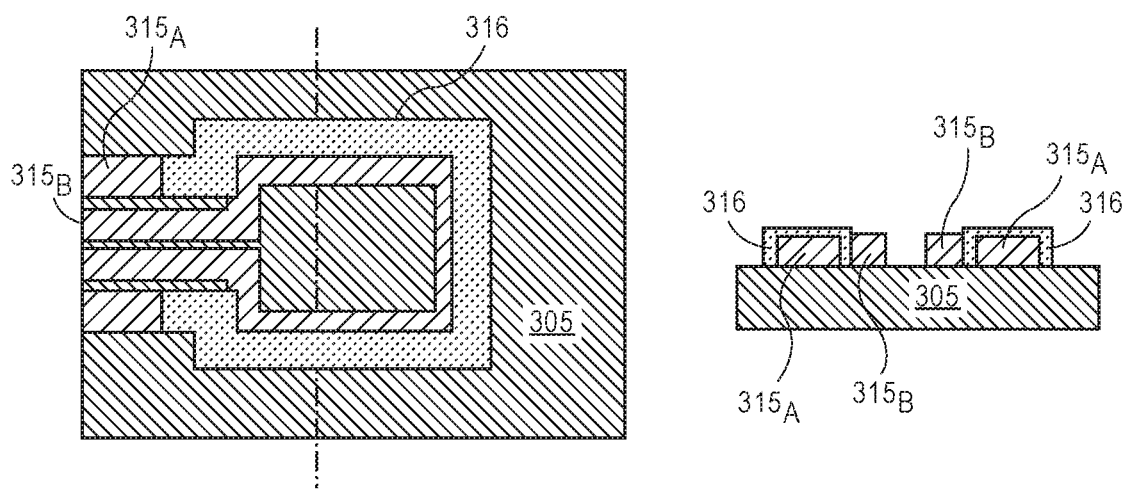
FIG. 3E is a plan view and a corresponding cross-sectional illustration of the package substrate after the second photoresist material and the exposed portions of the seed layer have been removed, according to an embodiment of the invention.

Referring now to FIG. 3E, the second photoresist material 386 is stripped and the exposed portions of the seed layer 335 are removed. According to an embodiment, the seed layer 335 may be removed with a seed etching process. Embodiments may then include forming a second dielectric layer (not shown) over the first and second conductive loops $315_A$ and $315_B$. According to an embodiment the second dielectric layer may be formed with any suitable process, such as lamination or slit coating and curing.

Additional embodiments of the invention may also include forming integrated capacitors with high capacitance density. As described above the high capacitance density provided by embodiments of the invention allows for a decrease in the area of the capacitors, which results in a decrease in cost and/or a reduction in the overall size of the package. The capacitance density of a capacitor can be increased in a couple different ways. First, the surface area of the first and second capacitor plates that face each other can be increased. This may be accomplished by forming interdigitated stubs (e.g., a square meandering pattern, a saw tooth pattern, or the like) in the conductive plates. Additionally, the capacitance density can be increased to a much greater extent by decreasing the thickness of the dielectric layer that separates the first and second capacitor plates.

Similar to the problems described above with respect to currently available transformers, the thickness of the dielectric layer that separates the capacitor plates in currently available capacitors is limited by the thickness of the dielectric layers used to form each routing layer. As noted above, this thickness is typically about 25 µm or greater. As such, the capacitance density of currently available integrated capacitors is less than about 2 pF/mm². Accordingly, embodiments of the invention may use processing operations that allow for the distance between the first and second capacitor plates to be significantly reduced. Examples of capacitors formed in accordance with embodiments of the invention are illustrated and described with respect to FIGS. 5A-5D.

Figure 5A:
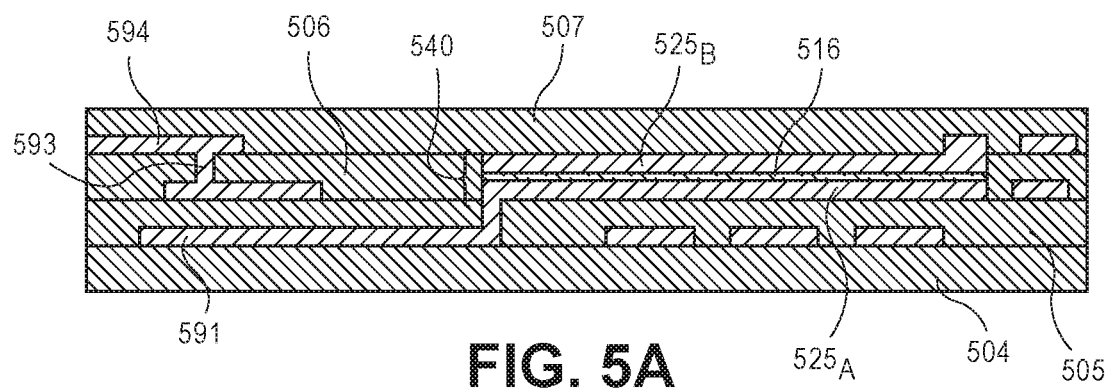
FIG. 5A is a cross-sectional view of a package substrate that includes a parallel plate capacitor formed within a single dielectric layer, according to an embodiment of the invention.

Referring now to FIG. 5A, a cross-sectional view of a package that includes a capacitor 540 and other conductive features (e.g., lines 591, 592, 594, and via 593) is shown according to an embodiment of the invention. As illustrated, the capacitor 540 includes a first capacitor plate $525_A$ formed over a dielectric layer 505. The second conductive plate $525_B$ is separated from the first capacitor plate $525_A$ by a dielectric spacer 516. Instead of being limited by the thickness of dielectric layers of the package (e.g., 504, 505, 506, 507) the distance separating the two capacitor plates may be dictated by the thickness of the dielectric spacer 516. For example, the dielectric spacer 516 may be less than 20 µm. As such, the entire capacitor may be formed within a single routing layer 506 of the package. Additional embodiments allow for the dielectric spacer 516 to be reduced in thickness to less than 1 µm. As such, the capacitance density can be increased by one or more orders of magnitude compared to currently available devices. For example, the capacitance density of a parallel plate capacitor according to embodiments of the invention may be approximately 200 pF/mm² or greater.

Figure 5B:
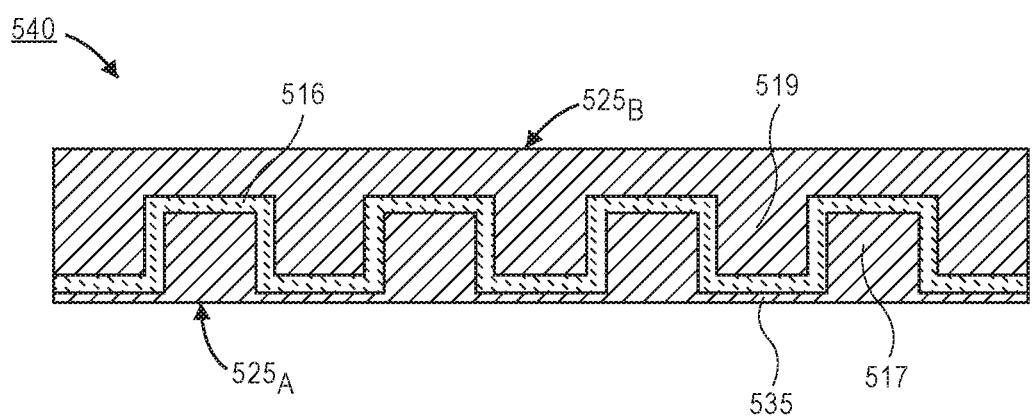
FIG. 5B is a cross-sectional view of a capacitor with interdigitated extensions that may be included in a layer of a packaging substrate, according to an embodiment of the invention.

Referring now to FIG. 5B, a cross-sectional view of a capacitor with interdigitated extensions is shown according to an embodiment of the invention. In order to provide a clearer view of aspects of the invention, portions of the package (e.g., the packaging layers and other conductive lines and vias) are omitted. As illustrated, the first capacitor plate $525_A$ may include first extensions 517 that extend up from a seed layer 535. The second capacitor plate $525_B$ may also include second extensions 519 that are interdigitated with the first extensions 517. Similar to the capacitor 540 illustrated in FIG. 5A, the two capacitor plates are separated by a dielectric spacer 516. Furthermore, it will be appreciated when reviewing the process flow below that the interdigitated extensions are self-aligned with each other. This allows for the pitch of the extensions to be decreased without needing to account for misalignment between layers. Accordingly, embodiments of the invention may increase the capacitance density to even greater extents than available with planar capacitors formed according to an embodiment of the invention.

Due to the self-aligning nature of the second capacitor plate $525_B$, those skilled in the art will note that extending the meandering pattern of the interdigitated extensions in multiple dimensions is possible as well. In FIG. 5C, a perspective view of a first capacitor plate $525_A$ with a meandering pattern formed in the X-Z plane (i.e., a two-dimensional square meander pattern) is shown, according to an embodiment of the invention. In FIG. 5C the dielectric spacer 516 and the second capacitor plate are omitted in order to not obscure the square meander pattern. As shown, the extensions 517 are formed in the X-Z plane and extend continuously to the ends of the plate in the Y-direction. In an additional embodiment illustrated in the perspective view shown in FIG. 5D, the interdigitated square meander pattern of the first capacitor plate $525_A$ and the second capacitor plate $525_B$ is formed in the X, Y, and Z dimensions (i.e., a three-dimensional square meander pattern).

A process flow for forming a square meander capacitor according to such an embodiment is illustrated in FIGS. 6A-6D. The process flow illustrated in the Figures depicts a cross-sectional view of the meandering patterned capacitor. However, it is to be appreciated that the processing illustrated in FIGS. 6A-6D may be used to form either a two-dimensional meandering pattern similar to the device illustrated in FIG. 5C or a three-dimensional pattern similar to the device illustrated in FIG. 5D.

Figure 6A:
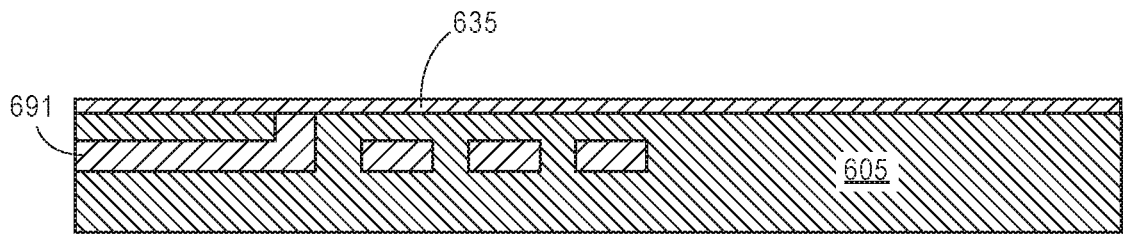
FIG. 6A is a cross-sectional illustration of a package substrate with a dielectric layer that has a seed layer formed over the surface, according to an embodiment of the invention.

Referring now to FIG. 6A, cross-sectional view of a package is illustrated according to an embodiment of the invention. The package may include a dielectric layer 605 that has a seed layer 635 formed over the top surface. By way of example, the dielectric layer 605 may be a polymer material, such as, for example, polyimide, epoxy, or BF. In an embodiment, the dielectric layer 605 may be one layer in a stack that includes a plurality of dielectric layers used to form a build-up structure. As such, the dielectric layer 605 may be formed over another dielectric layer that includes interconnect lines and vias 691. Additional embodiments may include forming the dielectric layer 605 as the first dielectric layer over a core material on which the stack is formed. In an embodiment, the seed layer 635 may be a copper seed layer.

Figure 6B:
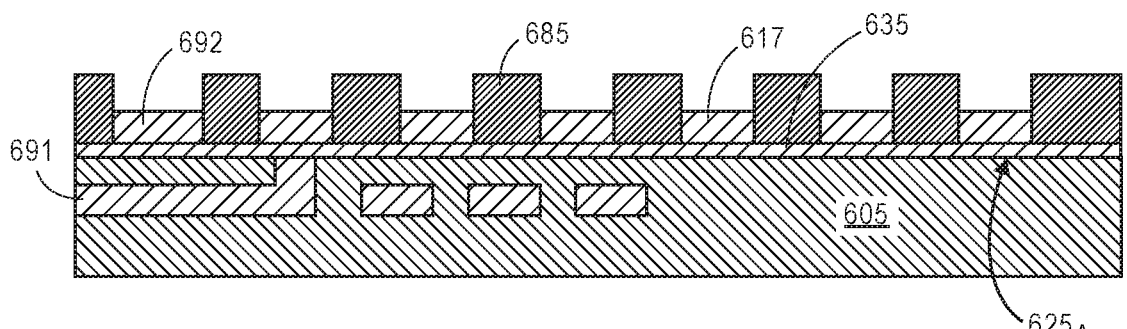
FIG. 6B is a cross-sectional illustration of the package substrate after a first meandering plate is formed over a surface of the substrate, according to an embodiment of the invention.

Referring now to FIG. 6B, a photoresist material 685 may be formed over the seed layer 635 and patterned to provide openings for the formation for a via pad 692 and the first capacitor plate $625_A$. According to an embodiment, the patterning of the photoresist material 685 may be implemented with lithographic processes (e.g., exposed with a radiation source through a mask (not shown) and developed with a developer). After the photoresist material 685 has been patterned, the first capacitor plate $625_A$ may be formed with an suitable deposition process, such as an electroplating process or the like. It is to be appreciated that while only the first capacitor plate $625_A$ is illustrated in FIG. 6B, embodiments of the invention may include forming a plurality of first capacitor plates $625_A$ and that the first capacitor plates $625_A$ may be formed at the same time as other conductive lines (e.g., signal lines or the like) may be formed over the first dielectric layer 605. According to an embodiment, the first capacitor plate $625_A$ may include a plurality of first extensions 617. Each of the extensions may extend up from the seed layer 635. As such, each of the first extensions 617 may be electrically coupled to each other by the seed layer 635. Those skilled in the art will appreciate that as the pitch of the extensions is decreased, the capacitance per area increases. In some embodiments, the pitch of the extensions 617 may be approximately 100 µm or smaller. Additional embodiments of the invention may include extensions 617 that have a pitch of approximately 20 µm or smaller.

Figure 6C:
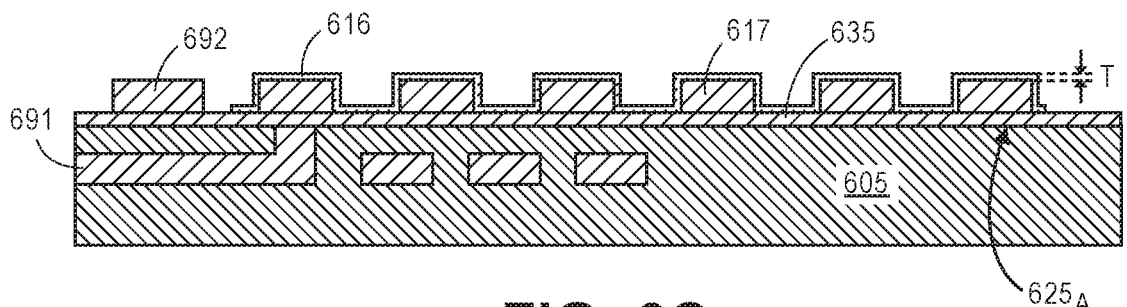
FIG. 6C is a cross-sectional illustration of the package substrate after a dielectric spacer layer is formed over the first meandering plate, according to an embodiment of the invention.

Referring now to FIG. 6C, a dielectric spacer layer 616 is formed over the surfaces of the first capacitor plate $625_A$. The dielectric spacer layer 616 provides the spacing between the first capacitor plate $625_A$ and a second capacitor plate $625_B$ that will be formed in a subsequent processing operation. As described above, the capacitance density of the capacitor formed by the first and second capacitor plates may be increased by decreasing the distance between the first and second capacitor plates. Accordingly, controlling the thickness T of the dielectric spacer layer 616 will provide the desired capacitance density for the capacitor. In an embodiment, the dielectric spacer layer 616 may have thickness T that provides a capacitance density that is approximately 10 pF/mm² when the thickness T of the dielectric spacer layer is approximately 10 µm or less. However, embodiments of the invention may produce a significantly higher capacitance density by reducing the thickness T of the dielectric spacer layer 616 even further. For example, capacitance densities of may be approximately 400 pF/mm² or greater when the thickness T of the dielectric spacer layer 616 is reduced to below 1 µm.

Embodiments of the invention are able to form a dielectric spacer layer 616 with a controlled thicknesses T with any suitable deposition process. In one embodiment, the dielectric spacer layer 616 may be formed with a screen printing process. Additional embodiments may include a blanket deposition of the dielectric spacer layer 616. For example, a CVD process may be used. In such embodiments, the blanket dielectric spacer layer 616 may then be patterned to remove portions of the dielectric spacer layer 616 from over regions of the device (e.g., from over portions of the seed layer 635 that will not be a part of the first capacitor plate $625_A$ and over the via pad 692). Additional embodiments may include lamination of a thin dielectric build up layer followed by selective patterning and removal. Further embodiments may include lamination of a photo-definable dielectric material which is then removed using lithographic exposure and developing.

Figure 6D:
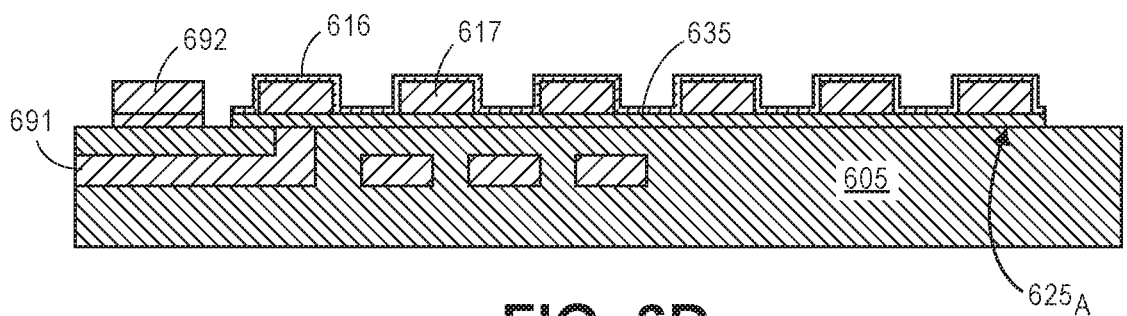
FIG. 6D is a cross-sectional illustration of the package substrate after the exposed portions of the seed layer are removed, according to an embodiment of the invention.

Referring now to FIG. 6D, the remaining portions of the seed layer 635 that are exposed after the dielectric spacer 616 is formed may be removed. In an embodiment the seed layer 635 may be removed with a seed layer etching process. The seed layer etching process electrically isolates the first capacitor plate $625_A$ from other conductive components (e.g., the via pad 692) formed over the first dielectric layer 605.

Figure 6E:
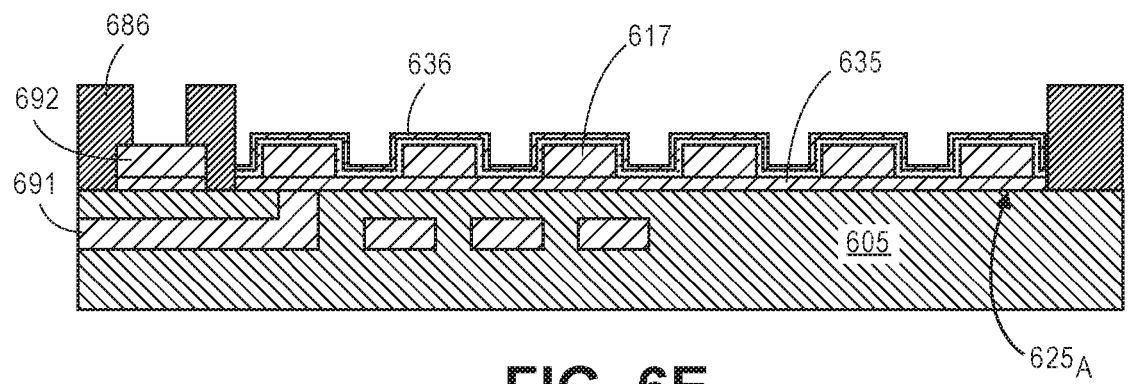
FIG. 6E is a cross-sectional illustration of the package substrate after a patterned photoresist material is formed over the surface and a second seed layer is formed over the dielectric spacer layer, according to an embodiment of the invention.

Referring now to FIG. 6E, a second seed layer 636 is formed over the dielectric spacer 616. The second seed layer 616 may be a copper seed layer that is blanket deposited. The second seed layer 636 may be blocked from being formed over the exposed portions of the first dielectric layer 605 by depositing and patterning a second photoresist material 686. According to an embodiment, the patterned openings of the second photoresist material 686 may include an opening for where the second capacitor plate will be formed in addition to providing a pattern for where vias will be formed. For example, the second photoresist material 686 may include an opening over the via pad 692.

Figure 6F:
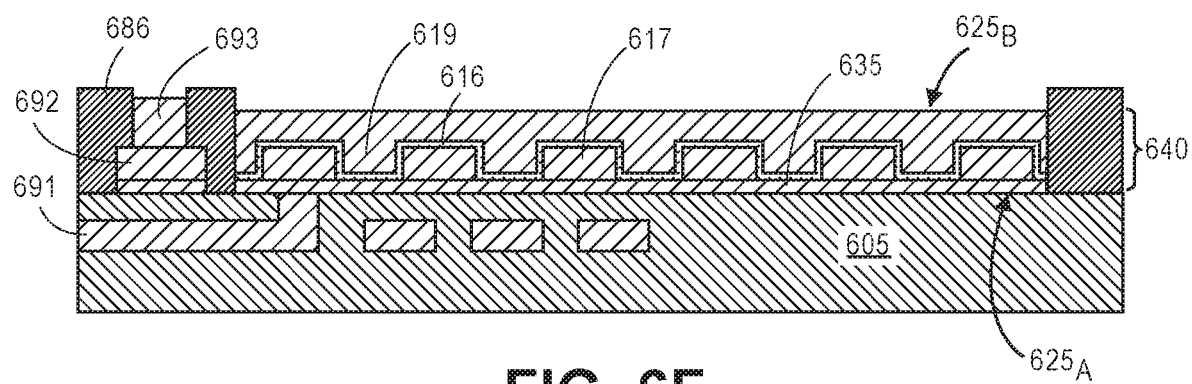
FIG. 6F is a cross-sectional illustration of the package substrate after a second meandering plate is formed over the dielectric spacer layer, according to an embodiment of the invention.

Referring now to FIG. 6F, the second capacitor plate $625_B$ may be selectively formed over the second seed layer 636 with any suitable deposition process, such as an electroplating process or the like. Due to the selective deposition over the second seed layer 636, the second capacitor plate $625_B$ is formed with second extensions 619 that are self-aligned and interdigitated with the first extensions 617. Furthermore, it is to be appreciated that the metal deposition process used to form the second capacitor plate $625_B$ may also be used to simultaneously form any needed vias 693. It is to be appreciated that while only the second capacitor plate $625_B$ and a single via 693 is illustrated in FIG. 6F, embodiments of the invention may include forming a plurality of second capacitor plates $625_B$ and a plurality of vias 693 or other conductive structures needed in the layer of the package.

Figure 6G:
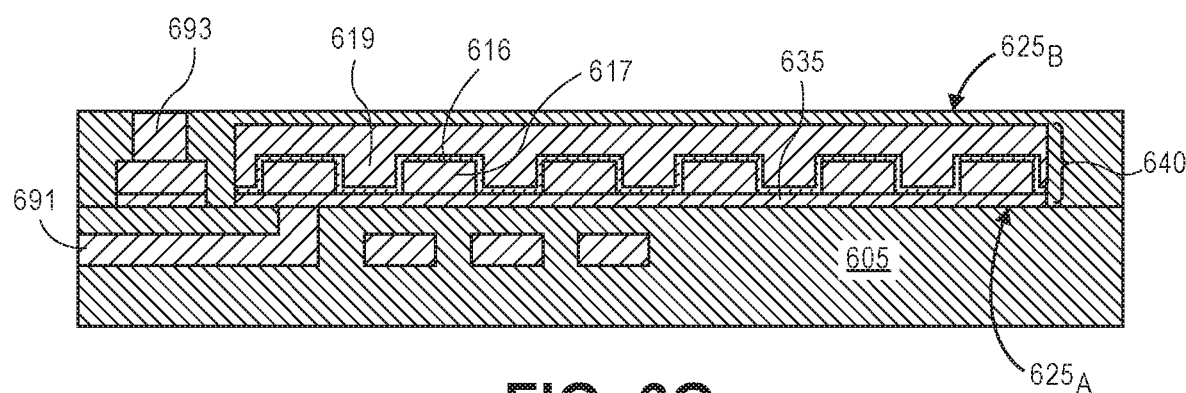
FIG. 6G is a cross-sectional illustration of the package substrate after a second dielectric layer is deposited over the surface of the package, according to an embodiment of the invention.

Referring now to FIG. 6G, the second photoresist material 686 is stripped and a second dielectric layer 606 may be formed over the second capacitor plate $625_B$ and the via 693. According to an embodiment the second dielectric layer may be formed with any suitable process, such as lamination or slit coating and curing. In an embodiment, the second dielectric layer 606 is formed to a thickness that will completely cover a top surface of the vias 693 and the second capacitor plate $625_B$. As opposed to layer formation on crystalline structures (e.g., silicon substrates), each of the dielectric layers may not be highly uniform. Accordingly, the second dielectric layer 606 may be formed to a thickness that is greater than the combined height of the vias 693 and the via pads 692 to ensure that the proper thickness is reached across the entire substrate. When the second dielectric is formed above the via 693, a controlled etching process may then be used to expose the top surface of the via 693, as illustrated in FIG. 6G.

In an embodiment, the dielectric removal process may include a wet etch, a dry etch (e.g., a plasma etch), a wet blast, or a laser ablation (e.g., by using excimer laser). According to an additional embodiment, the depth controlled dielectric removal process may be performed only proximate to the via 693. For example, laser ablation of the second dielectric layer 606 may be localized proximate to the location of the via 693. In some embodiments, the thickness of the second dielectric layer 606 may be minimized in order to reduce the etching time required to expose the line via 693. In other embodiments, when the thickness of the dielectric can be well controlled, the vias 693 may extend above the top surface of the second dielectric layer 606 and the controlled dielectric removal process may be omitted.

Furthermore, it is to be appreciated that the top surface of the second capacitor plate $625_B$ is covered by the second dielectric layer 606 in some embodiments. As such, the subsequently formed signal lines on the next layer may be formed directly above portions of the second capacitor plate $625_B$. In additional embodiments where the second conductor plate $625_B$ is extended into the next routing layer, the second dielectric layer 606 may be recessed to expose a top portion of the $625_B$ in addition to exposing a top portion of the via 693.

Figure 7:
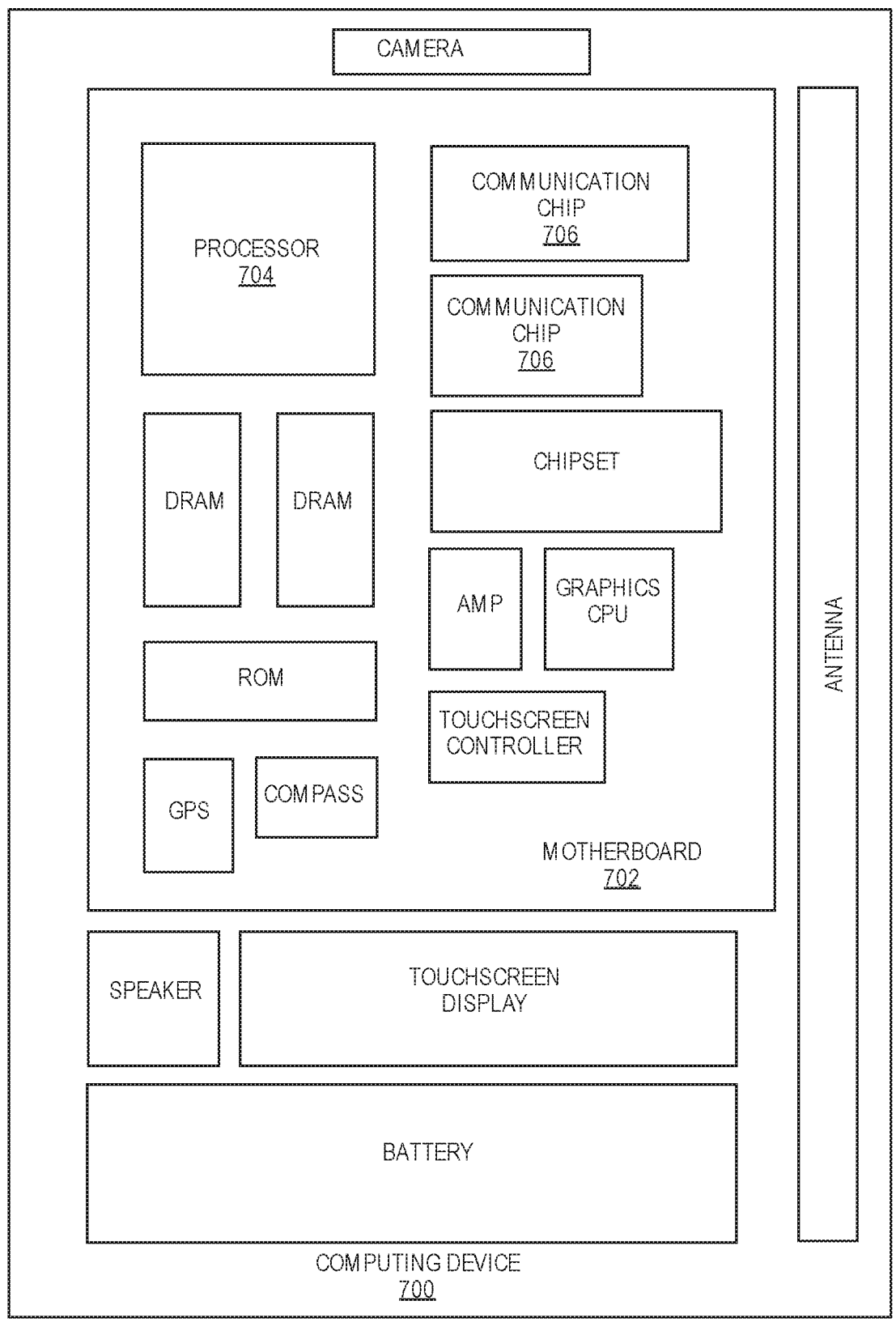
FIG. 7 is a schematic of a computing device built in accordance with an embodiment of the invention.

FIG. 7 illustrates a computing device 700 in accordance with one implementation of the invention. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

Depending on its applications, computing device 700 may include other components that may or may not be physically and electrically coupled to the board 702. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. In some implementations of the invention, the integrated circuit die of the processor includes one or more devices, such as devices that are packaged in a system that includes one or more integrated transformers and/or capacitors that are formed with a dielectric spacer layer, in accordance with implementations of the invention. The term "processor" may refer to any device or portion of a device that processes electronic data from registers and/or memory to transform that electronic data into other electronic data that may be stored in registers and/or memory.

The communication chip 706 also includes an integrated circuit die packaged within the communication chip 706. In accordance with another implementation of the invention, the integrated circuit die of the communication chip includes one or more devices, such as devices that are packaged in a system that includes one or more integrated transformers and/or capacitors that are formed with a dielectric spacer layer, in accordance with implementations of the invention.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

An embodiment of the invention may include a transformer formed in an electrical package comprising: a first dielectric layer; a first conductive loop formed over a surface of the first dielectric layer; a dielectric spacer formed over the first conductive loop; and a second conductive loop separated from the first conductive loop by the dielectric spacer layer.

An additional embodiment of the invention may include a transformer formed in an electrical package, wherein the second conductive loop is formed above the first conductive loop.

An additional embodiment of the invention may include a transformer formed in an electrical package, wherein the first conductive loop and the second conductive loop are formed in a single routing layer of the electrical package An additional embodiment of the invention may include a transformer formed in an electrical package, wherein the dielectric spacer layer is former only over a top surface of the first conductive loop.

An additional embodiment of the invention may include a transformer formed in an electrical package, wherein the second conductive loop is formed over the first dielectric layer, and wherein a sidewall surface of the first conductive loop is separated from a sidewall surface of the second conductive loop by the dielectric spacer.

An additional embodiment of the invention may include a transformer formed in an electrical package, wherein the dielectric spacer includes a cap layer formed over a top surface of the first conductive loop and a sidewall spacer formed over the sidewalls of the first conductive loop.

An additional embodiment of the invention may include a transformer formed in an electrical package, wherein the cap layer is a different material than the sidewall spacer.

An additional embodiment of the invention may include a transformer formed in an electrical package, wherein the second conductive loop is formed inside a perimeter of the first conductive loop.

An additional embodiment of the invention may include a transformer formed in an electrical package, wherein the dielectric spacer layer has a thickness that is less than 20 μm.

An additional embodiment of the invention may include a transformer formed in an electrical package, wherein the dielectric spacer layer has a thickness that is less than 5 μm.

An embodiment of the invention may include a method of forming a transformer in an electrical package, comprising: forming a first conductive loop over a first dielectric layer; forming a dielectric spacer layer over the first conductive loop; and forming a second conductive loop in direct contact with the dielectric spacer layer, wherein the first conductive loop is spaced apart from the second conductive loop by only the dielectric spacer layer.

An additional embodiment of the invention may include a method, wherein the second conductive loop is formed over a top surface of the first conductive loop.

An additional embodiment of the invention may include a method, wherein forming the second conductive loop comprises: forming a seed layer over the dielectric spacer layer; depositing and patterning a photoresist material to form openings above the first conductive loop; and plating a conductive material in the openings.

An additional embodiment of the invention may include a method, wherein the second conductive loop is formed side-by-side with the first conductive loop.

An additional embodiment of the invention may include a method, wherein forming the dielectric spacer layer comprises: forming a cap layer over a top surface of the first conductive loop; forming a conformal spacer layer over the exposed surfaces; and etching the conformal spacer layer with an anisotropic etching process to remove the conformal spacer layer from horizontal surfaces, wherein a sidewall spacer remains along sidewalls of the first conductive loop.

An embodiment of the invention includes a capacitor formed in an electrical package comprising: a first dielectric layer; a first capacitor plate formed over a surface of the first dielectric layer; a dielectric spacer formed over a surface of the first capacitor plate; and a second capacitor plate separated from the first capacitor plate by the dielectric spacer layer.

An additional embodiment of the invention includes a capacitor formed in an electrical package, wherein the first and second capacitor plates are formed in a single routing layer of the package.

An additional embodiment of the invention includes a capacitor formed in an electrical package, wherein the dielectric spacer is less than 10 µm thick.

An additional embodiment of the invention includes a capacitor formed in an electrical package, wherein the first and second capacitor plates include interdigitated square meander extensions.

An additional embodiment of the invention includes a capacitor formed in an electrical package, wherein the extensions are formed in three-dimensions.

An embodiment of the invention includes a method for forming a capacitor in an electrical package, comprising: forming a first capacitor plate over a first dielectric layer; forming a dielectric spacer layer over the first capacitor plate; and forming a second capacitor plate in direct by with the dielectric spacer layer, wherein the first capacitor plate is spaced apart from the second capacitor plate by only the dielectric spacer layer.

An additional embodiment of the invention includes a method, wherein forming the first capacitor plate comprises: forming a first seed layer over the first dielectric layer; depositing a photoresist material over the first seed layer; patterning the photoresist material to form one or more openings; and depositing a conductive material into the openings.

An additional embodiment of the invention includes a method, wherein the dielectric spacer layer is formed with a screen printing process, a chemical vapor depositions process, a lamination process, or a photolithographic patterning of a photodefinable dielectric layer.

An additional embodiment of the invention includes a method, wherein forming the second capacitor plate comprises: forming a second seed layer over a surface of the dielectric spacer layer; and growing the second capacitor plate form the second seed layer with an electroplating process.

An additional embodiment of the invention includes a method, wherein the second capacitor plate is formed concurrently with the formation of one or more vias.

What is claimed is:

1. A transformer in an electrical package comprising:
   a first dielectric layer;
   a first conductive loop over a surface of the first dielectric layer, wherein a first trace forming the first conductive loop has a first width and a bottommost surface;
   a dielectric spacer over the first conductive loop;
   a second conductive loop over the surface of the dielectric layer, the second conductive loop laterally adjacent to the first conductive loop in a same plane, and the second conductive loop separated from the first conductive loop by the dielectric spacer layer, wherein the first conductive loop is not electrically connected to the second conductive loop, wherein a second trace forming the second conductive loop has a second width that is smaller than the first width, and wherein the second trace has a bottommost surface co-planar with the bottommost surface of the first trace; and
   a second dielectric layer, wherein the first conductive loop, the second conductive loop, and the dielectric spacer are within the second dielectric layer.

2. The transformer of claim 1, wherein the second conductive loop is formed inside a perimeter of the first conductive loop.

3. The transformer of claim 1, wherein the dielectric spacer layer has a thickness that is less than 20 µm.

4. The transformer of claim 3, wherein the dielectric spacer layer has a thickness that is less than 5 µm.

5. The transformer of claim 1, wherein the dielectric spacer includes a cap layer formed over a top surface of the first conductive loop and a sidewall spacer formed over the sidewalls of the first conductive loop.

6. A transformer in an electrical package comprising:
   a first dielectric layer;
   a first conductive loop over a surface of the first dielectric layer, wherein a first trace forming the first conductive loop has a first width;
   a dielectric spacer over the first conductive loop;
   a second conductive loop laterally adjacent to the first conductive loop, the second conductive loop separated from the first conductive loop by the dielectric spacer layer, wherein the first conductive loop is not electrically connected to the second conductive loop, and wherein a second trace forming the second conductive loop has a second width that is smaller than the first width, wherein the second conductive loop is formed over the first dielectric layer, and wherein a sidewall surface of the first conductive loop is separated from a sidewall surface of the second conductive loop by the dielectric spacer; and
   a second dielectric layer, wherein the first conductive loop, the second conductive loop, and the dielectric spacer are within the second dielectric layer, wherein the dielectric spacer includes a cap layer formed over a top surface of the first conductive loop and a sidewall spacer formed over the sidewalls of the first conductive loop.

7. A transformer formed in an electrical package comprising:
   a first dielectric layer;
   a first conductive loop formed over a surface of the first dielectric layer;
   a dielectric spacer formed over the first conductive loop; and
   a second conductive loop separated from the first conductive loop by the dielectric spacer layer, wherein the first conductive loop is not electrically connected to the second conductive loop, wherein the dielectric spacer includes a cap layer formed over a top surface of the first conductive loop and a sidewall spacer formed over the sidewalls of the first conductive loop, and wherein the cap layer is a different material than the sidewall spacer.

8. A method of forming a transformer in an electrical package, comprising:
- forming a first conductive loop over a first dielectric layer, wherein a first trace forming the first conductive loop has a first width and a bottommost surface;
- forming a dielectric spacer layer over the first conductive loop;
- forming a second conductive loop, wherein the first conductive loop is not electrically connected to the second conductive loop, wherein a second trace forming the second conductive loop has a second width that is smaller than the first width, wherein the second trace has a bottommost surface co-planar with the bottommost surface of the first trace, and wherein the second conductive loop is formed laterally adjacent to first conductive loop in a same plane, and wherein forming the second conductive loop comprises:
  - forming a seed layer over the dielectric spacer layer;
  - depositing and patterning a photoresist material to form openings above the first conductive loop; and
  - plating a conductive material in the openings; and
- forming a second dielectric layer, wherein the first conductive loop, the second conductive loop, and the dielectric spacer are within the second dielectric layer.

9. The method of claim 8, wherein the dielectric spacer includes a cap layer formed over a top surface of the first conductive loop and a sidewall spacer formed over the sidewalls of the first conductive loop.

* * * * *